US010586181B2

(12) United States Patent
Goldstein et al.

(10) Patent No.: US 10,586,181 B2
(45) Date of Patent: Mar. 10, 2020

(54) GENERATION OF OCCUPANT ACTIVITIES BASED ON RECORDED OCCUPANT BEHAVIOR

(75) Inventors: Rhys Goldstein, Toronto (CA); Azam Khan, Aurora (CA); Alexander Tessier, Toronto (CA)

(73) Assignee: AUTODESK, INC., San Rafael, CA (US)

(*) Notice: Subject to any disclaimer, the term of this patent is extended or adjusted under 35 U.S.C. 154(b) by 485 days.

(21) Appl. No.: 13/440,952

(22) Filed: Apr. 5, 2012

(65) Prior Publication Data

US 2012/0265501 A1 Oct. 18, 2012

Related U.S. Application Data

(60) Provisional application No. 61/474,723, filed on Apr. 12, 2011.

(51) Int. Cl.
| *G06F 17/10* | (2006.01) |
| *G06F 7/60* | (2006.01) |
| *G06Q 10/04* | (2012.01) |
| *G06Q 50/06* | (2012.01) |
| *G06Q 50/16* | (2012.01) |
| *G06F 17/50* | (2006.01) |

(52) U.S. Cl.
CPC ........... *G06Q 10/04* (2013.01); *G06Q 50/06* (2013.01); *G06Q 50/16* (2013.01); *G06F 17/5004* (2013.01); *G06F 17/5009* (2013.01)

(58) Field of Classification Search
CPC ........ G06Q 10/04; G06Q 50/06; G06Q 50/16; G06F 17/5004; G06F 17/5009

USPC .............................................. 703/2, 6, 16, 17
See application file for complete search history.

(56) References Cited

U.S. PATENT DOCUMENTS

| 6,377,858 | B1* | 4/2002 | Koeppe .................. G05B 15/02 700/12 |
| 8,355,827 | B2* | 1/2013 | Egnor et al. .................. 700/291 |
| 8,532,839 | B2* | 9/2013 | Drees ..................... G05B 15/02 700/108 |
| 8,754,773 | B1* | 6/2014 | Von Gunten ......... G08B 15/002 340/309.16 |
| 2004/0102937 | A1 | 5/2004 | Ibrahim |
| 2005/0171645 | A1 | 8/2005 | Oswald et al. |

(Continued)

OTHER PUBLICATIONS

Vincent Tabak (User Simulation of Space Utilization System for Office Building Usage Simulation,"Doctoral Thesis", 2009, (227 pages)).*

(Continued)

*Primary Examiner* — Andre Pierre Louis
(74) *Attorney, Agent, or Firm* — Artegis Law Group, LLP (57) ABSTRACT

A method and apparatus for simulating occupant behavior in buildings may be used to predict the energy use of a building structure. The activities of actual building occupants are recorded and provided as an input to the occupant behavior simulation. The occupant behavior simulation generates simulated occupant schedules with similar behavioral patterns. An arbitrary set of factors can be used to select plausible activity types, durations, and numbers of participants during an occupant behavior simulation. The simulated occupant schedules may then be incorporated into a building performance simulation to help architects predict the energy demand associated with different building design options.

18 Claims, 8 Drawing Sheets

(56) References Cited

U.S. PATENT DOCUMENTS

| | | | |
|---|---|---|---|
| 2005/0190053 A1* | 9/2005 | Dione | G06Q 10/06 340/500 |
| 2005/0279844 A1 | 12/2005 | Bagwell et al. | |
| 2005/0284158 A1 | 12/2005 | Lee et al. | |
| 2006/0111816 A1 | 5/2006 | Spalink et al. | |
| 2006/0265192 A1 | 11/2006 | Turicchi, Jr. | |
| 2007/0057779 A1 | 3/2007 | Battista et al. | |
| 2007/0168155 A1 | 7/2007 | Ravela et al. | |
| 2008/0037897 A1 | 2/2008 | Chiang et al. | |
| 2009/0005912 A1 | 1/2009 | Srivastava et al. | |
| 2010/0025483 A1* | 2/2010 | Hoeynck et al. | 236/1 C |
| 2010/0111400 A1 | 5/2010 | Ramirez et al. | |
| 2010/0121613 A1 | 5/2010 | Rosca et al. | |

OTHER PUBLICATIONS

Jessen Page (Simulation of Occupant presence and behavior in building, 2007, 134 pages).*

Parys et al. (Implementing realistic occupant behavior in building energy simulations, 2010 (8 pages)).*

Ian Richardson, et al., "Domestic electricity use: A high resolution energy demand model," Energy and Buildings, 2010, 10 pages.*

Vincent Tabak et al. (User Simulation Model: Overview and Validation Capturing human behavior in the building environment using RFID, 2006 (16 pages)).*

MacLennan et al. (An Engineering Model for the estimation of occupant premovement and or Response times and probability of their occurence, 1999 (9 pages)).*

Goldstein, et al., "Schedule-Calibrated Occupant Behavior Simulation", Autodesk Research, published 2010. (8 pages).

PCT Search Report, Application No. PCT/US2012/032942, dated Jun. 22, 2012.

Office Action for U.S. Appl. No. 13/440,955 dated May 12, 2014.

Kumar et al., "Minimum Description Length Denoising With Histogram Models", IEEE Transactions on Signal Processing, Aug. 2006, vol. 54, No. 8, pp. 2922-2928.

Stauffer et al., "Learning Patterns of Activity Using Real Time Tracking", IEEE Transactions on Pattern Analysis and Machine Intelligence, Aug. 2000, vol. 22, No. 8, pp. 747-757.

Page et al., "A Generalised Stochastic Model for the Simulation of Occupant Presence", Energy and Buildings, 2008, vol. 40, pp. 83-98.

Brandemuehl et al., "Effects of Variations of Occupant Behavior on Residential Building Net Zero Energy Performance", 12th Conference of International Building Performance Simulation Association, Sydney, 2011, pp. 2603-2610.

Harville et al., "Fast, Integrated Person Tracking and Activity Recognition with Plan-View Templates from a Single Stereo Camera", Computer Vision and Pattern Recognition, CVPR 2004, Proceedings of the 2004 IEEE Computer Society Conference on, vol. 2, pp. II-398. IEEE, 2004, 8 pages.

"Webster's Dictionary", retrieved from http://www.merriam-webster.com/dictionary/histogram, retrieved on Feb. 23, 2015, 1 page.

"Oxford English Dictionary", retrieved from http://www.oed.com/view/Entry/87286?redirectedFrom=histogram#eid, retrieved on Feb. 23, 2015, 2 pages.

Teixeira et al. "Lightweight People Counting and Localizing for Easily Deployable Indoors WSNs" IEEE Journal of Selected Topics in Signal Processing, vol. 2, No. 4 [retrieved on Nov. 21, 2018]. Retrieved from <https://ieeexplore.ieee.org/abstract/document/4629882> (Year. 2008).

"CRC Standard Mathematical Tables" 25th edition, edited by William H. Beyer, CRC Press, 1978, pp. 1-2 and 520 [retrieved on Apr. 5, 2018]. Retrieved from David Rogers.

* cited by examiner

Figure 3C — Normalized Arrays 340

| | | D[...]["off"] | | | | D[...]["work"] | | | | D[...]["meet"] | | | | D[...]["eat"] | | | |
|---|---|---|---|---|---|---|---|---|---|---|---|---|---|---|---|---|---|
| PVT / TOD | | off | work | meet | eat | off | work | meet | eat | off | work | meet | eat | off | work | meet | eat |
| 7 AM | | 0.00 | 0.00 | 0.00 | 0.00 | 1.00 | 0.81 | 0.98 | 0.98 | 0.00 | 0.19 | 0.02 | 0.02 | 0.00 | 0.00 | 0.00 | 0.00 |
| 8 AM | | 0.00 | 0.00 | 0.00 | 0.00 | 1.00 | 0.62 | 0.96 | 0.95 | 0.00 | 0.38 | 0.04 | 0.05 | 0.00 | 0.00 | 0.00 | 0.00 |
| 9 AM | | 0.00 | 0.00 | 0.00 | 0.00 | 0.98 | 0.15 | 0.81 | 0.72 | 0.02 | 0.85 | 0.19 | 0.28 | 0.00 | 0.00 | 0.00 | 0.00 |
| 10 AM | | 0.00 | 0.00 | 0.00 | 0.00 | 0.55 | 0.01 | 0.77 | 0.27 | 0.35 | 0.99 | 0.23 | 0.72 | 0.00 | 0.00 | 0.00 | 0.00 |
| 11 AM | | 0.00 | 0.00 | 0.00 | 0.00 | 0.79 | 0.17 | 0.99 | 0.81 | 0.13 | 0.55 | 0.01 | 0.13 | 0.08 | 0.28 | 0.00 | 0.01 |
| 12 PM | | 0.00 | 0.00 | 0.00 | 0.00 | 0.45 | 0.02 | 0.86 | 0.87 | 0.02 | 0.02 | 0.00 | 0.00 | 0.54 | 0.95 | 0.14 | 0.05 |
| 1 PM | | 0.00 | 0.00 | 0.00 | 0.00 | 0.64 | 0.06 | 0.71 | 0.99 | 0.00 | 0.00 | 0.00 | 0.00 | 0.35 | 0.94 | 0.29 | 0.13 |
| 2 PM | | 0.04 | 0.08 | 0.02 | 0.17 | 0.62 | 0.08 | 0.76 | 0.97 | 0.04 | 0.08 | 0.02 | 0.16 | 0.30 | 0.77 | 0.21 | 0.01 |
| 3 PM | | 0.30 | 0.47 | 0.04 | 0.36 | 0.38 | 0.02 | 0.90 | 0.66 | 0.28 | 0.46 | 0.04 | 0.31 | 0.04 | 0.05 | 0.01 | 0.02 |
| 4 PM | | 0.37 | 0.51 | 0.04 | 0.74 | 0.31 | 0.01 | 0.93 | 0.33 | 0.32 | 0.48 | 0.03 | 0.11 | 0.00 | 0.00 | 0.01 | 0.01 |
| 5 PM | | 0.74 | 0.90 | 0.25 | 0.84 | 0.15 | 0.00 | 0.73 | 0.15 | 0.11 | 0.09 | 0.02 | 0.05 | 0.00 | 0.00 | 0.00 | 0.00 |
| 6 PM | | 0.85 | 0.96 | 0.39 | — | 0.10 | 0.01 | 0.59 | 0.10 | 0.05 | 0.04 | 0.01 | — | 0.00 | 0.00 | 0.00 | 0.00 |

GENERATION OF OCCUPANT ACTIVITIES BASED ON RECORDED OCCUPANT BEHAVIOR

CROSS-REFERENCE TO RELATED APPLICATIONS

This application claims benefit of U.S. provisional patent application Ser. No. 61/474,723, filed Apr. 12, 2011, which is hereby incorporated herein by reference.

BACKGROUND OF THE INVENTION

Field of the Invention

Embodiments of the present invention generally relate to the modeling of building occupant behavior, and, more specifically, to generation of occupant activities based on recorded schedules. These figures in no way limit or are intended to limit the scope of the present invention.

Description of the Related Art

Buildings consume vast amounts of energy. Some estimate that they account for 72% of electricity use in the US. It has been suggested that appropriate design improvements, selected with the aid of decision-support software, could reduce energy use by about 30% in existing buildings and 50% to 75% in new buildings. This is the motivation for building performance simulation. The idea is to model a building's many interacting subsystems, including its occupants, electrical equipment, and indoor and outdoor climate. With simulation results in hand, an architect is better able to predict the energy demand associated with various designs and can choose from among the more sustainable options.

A building's energy consumption patterns depend largely on the behavior of the people that occupy it, a fact observed by comparing the timing of daily activities with profiles of energy use. Quantifying this behavior is a prerequisite for predicting when a building's equipment is likely to be in use, and assessing the adequacy of its lighting conditions, air temperature, and air quality. Many existing building performance simulation tools use fixed schedules to account for the presence of occupants but such schedules do not yield realistic results.

As the foregoing illustrates, there is a need in the art for more detailed and realistic occupancy models for accurate energy demand predictions.

SUMMARY OF THE INVENTION

The present invention generally provides a system and method for the generation of occupant activities based on recorded schedules. The activities of occupants of a representative building structure are recorded and provided as an input to the occupant behavior simulation. The occupant behavior simulation generates fictional schedules with similar behavioral patterns. An arbitrary set of factors can be used to select plausible activity types (tasks), durations, and numbers of participants during an occupant behavior simulation.

One embodiment of the present invention sets forth a method for generating one or more attributes of occupant behavior for a target building structure. The method includes the steps of receiving recorded occupant behavior data associated with a representative building structure and constructing a histogram of at least two dimensions that is populated with the recorded occupant behavior data. Normalized arrays of occupant behavior feature values are computed based on the histogram. One or more attributes of occupant behavior for a simulated occupant of the target building structure are generated based on the normalized arrays of occupant behavior feature values.

Occupant behavior simulation may be used to predict the energy use of a building structure. One advantage of the disclosed method is that building performance simulation may be used to reduce the impact of buildings on the environment by helping architects predict the energy demand associated with different design options.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
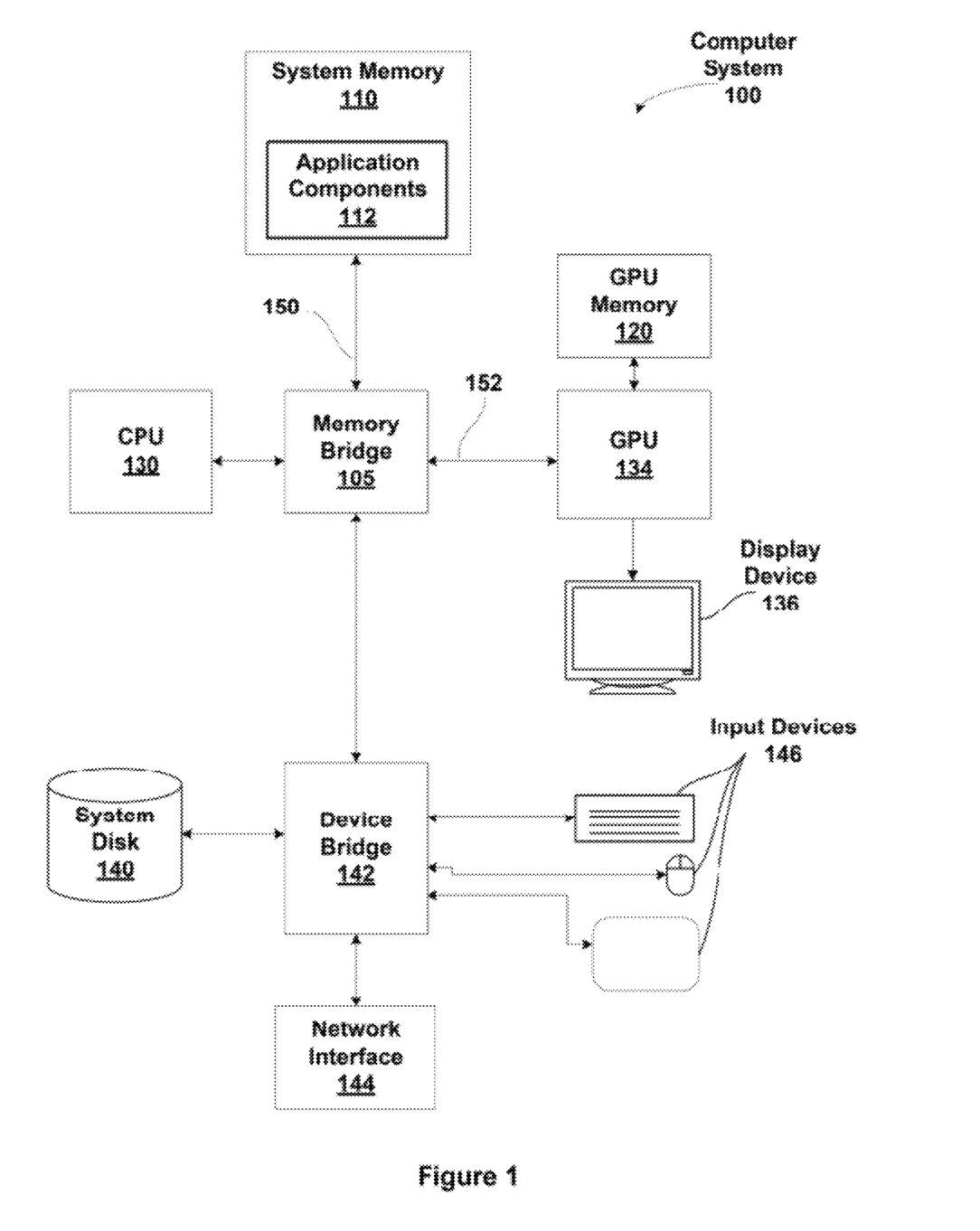
FIG. 1 illustrates a computer system configured to implement one or more aspects of the present invention.

FIG. 1 illustrates a computer system 100 configured to implement one or more aspects of the present invention. The computer system 100 includes, without limitation, a central processing unit (CPU) 130, a system memory 110, a graphics processing unit (GPU) 134, a GPU memory 120, a memory bridge 105, a display device 136, a system disk 140, a device bridge 142, a network interface 144, and input devices 146, e.g., a mouse, keyboard, touchpad, and the like. The display device 136 or a touchpad may be configured to use a capacitive sensing, camera generated images, or any other technology known to those skilled in the art to sense stylus and/or multi-finger input. In one embodiment, system memory 110 is configured to store application components 112 that are configured to generate attributes of occupant behavior that can be used to predict energy demand for a building structure.

The CPU 130 communicates with the system memory 110 via the memory bridge 105, which may be, e.g., a Northbridge device or subsystem. System memory 110 is configured to store application programs, as well as data used by or generated by the CPU 130. System memory 110 is coupled to the memory bridge 105 via a system memory bus 150. The memory bridge 105 is coupled to the GPU 134 via a GPU system bus 152. The GPU system bus 152 may comprise any technically feasible data interconnect, such as the well-known personal computer interconnect (PCI) express bus. The memory bridge 105 is also coupled to the device bridge 142 using an interconnect system such as PCI. The GPU 134 conventionally incorporates real time image rendering means for rendering both three-dimensional (3D) and two-dimensional (2D) images. The GPU 134 delivers pixel data to display device 136, which may comprise a conventional CRT (cathode ray tube) or LCD (liquid crystal display). The GPU 134 is coupled to the GPU memory 120 using a GPU memory bus 154. The GPU memory 120 may be configured to store data used by or generated by the GPU 134. Data stored within the GPU memory 120 passes through the GPU 134 and the memory bridge 105 when accessed by the CPU 130. In some embodiments, the integrated circuit implementing the CPU 130 may incorporate additional functional blocks, such as the memory bridge 105 and the device bridge 142. In alternative embodiments, the integrated circuit implementing the GPU 134 may incorporate additional functional blocks, such as the memory bridge 105 and the device bridge 142.

The device bridge 142 is coupled to a hard drive 140, a network interface 144, and input devices 146. The hard drive 140 provides mass storage of programs and data. The network interface 144 provides network connectivity to other computers using a local area network (LAN) interface using any suitable technology, such as Ethernet. The input devices 146 provide user input. Other components (not explicitly shown), including USB or other port connections, CD drives, DVD drives, film recording devices, and the like, may also be connected to I/O bridge 107. Communication paths interconnecting the various components in FIG. 1 may be implemented using any suitable protocols, such as PCI (Peripheral Component Interconnect), PCI Express (PCI-E), AGP (Accelerated Graphics Port), HyperTransport, Quick Path Interconnect, or any other bus or point-to-point communication protocol(s), and connections between different devices may use different protocols as is known in the art.

As used herein, the phrase "occupant behavior simulation" refers to a computer simulation performed by the application components 112 that generates fictional occupant schedules. An "occupant schedule" is a description of the behavior of a building occupant over the course of a single day. Each of these schedules takes the form of a chronological sequence of consecutive activities, with an "activity" being a description of an occupant's behavior during a specific time interval. Each activity has several associated attributes. The attributes include at least the "task", which identifies the type of activity. Each task may be selected from a pre-defined list of possible tasks through a user-interface. For example, to generate an attribute of an office building, there would likely be one possible task representing desk work, another possible task for meetings, and the like.

Figure 2:
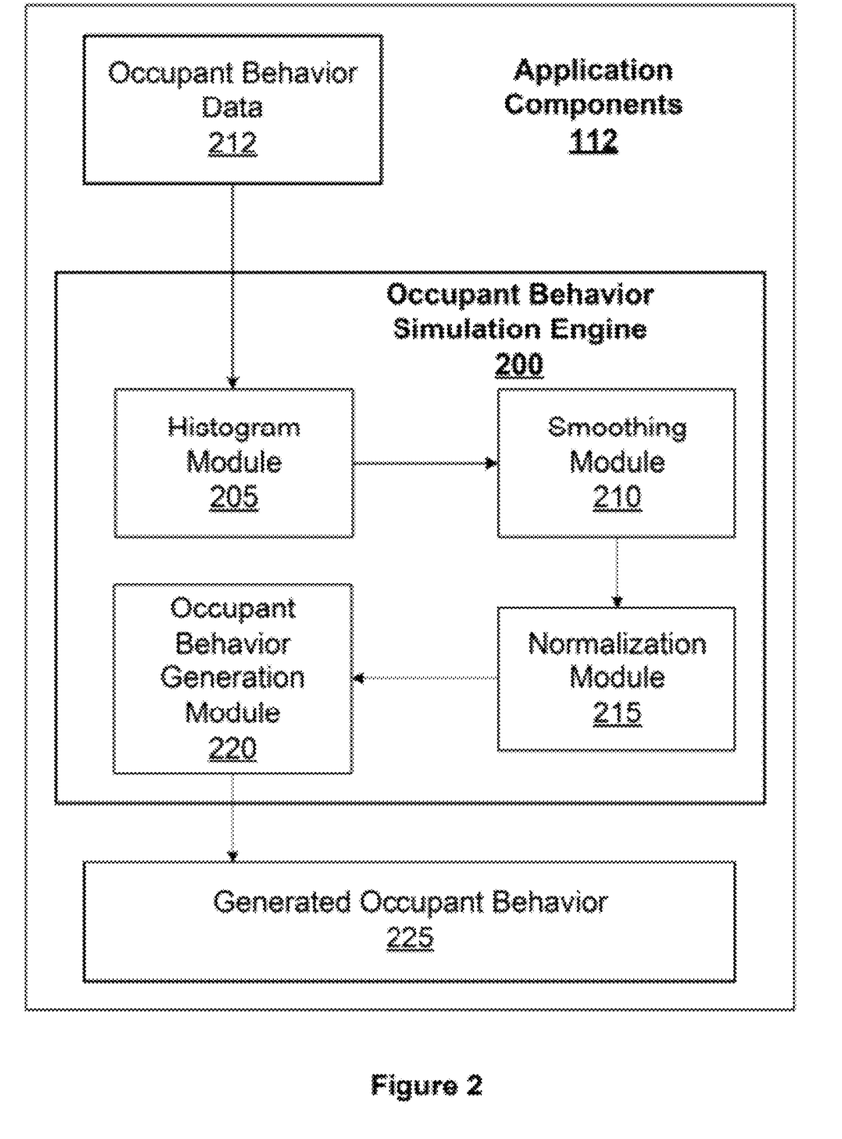
FIG. 2 illustrates the application components shown in FIG. 1, according to one embodiment of the invention.

FIG. 2 illustrates the application components 112 shown in FIG. 1, according to one embodiment of the invention.

The application components 112 include an occupant behavior simulation engine 200, recorded occupant behavior data 212, and generated occupant behavior 225. The occupant behavior simulation engine 200 receives the recorded occupant behavior data 212 and generates the generated occupant behavior 225 that includes one or more attributes, e.g., task performed, number of participants, and/or duration. The occupant behavior simulation engine 200 includes a histogram module 205, a smoothing module 210, a normalization module 215, and an occupant behavior generation module 220.

The occupant behavior simulation engine 200 implements a schedule-calibrated technique to produce the generated occupant behavior 225. In contrast with prior art techniques, the occupant behavior simulation engine 200 allows past behavior of occupants (actual and generated) to influence the future behavior that is generated for simulated occupants. For example, if a first simulated occupant has taken a lunch break only three minutes ago, as opposed to three hours ago, the occupant behavior simulation engine 200 may be less likely to generate a meal attribute in the next three minutes of a schedule for the first simulated occupant.

The activities defined in the recorded occupant behavior data 212 include attributes such as the task, number of participants, and duration. The occupant behavior simulation engine 200 generates attributes one at a time using a mathematical technique where each attribute depends on an arbitrary set of factors that influence the generated attributes. The generated behavior for an occupant should depend in part on the time of day, so the time of day is a factor. Other factors, such as the previous task performed by the occupant, time elapsed since the previous or same task was performed, and the number of occupants participating in a task may also be used to influence the generated behavior. Once a particular attribute is generated from a set of factors, that attribute can itself become a factor for the generation of another attribute. For example, if the time of day is used as a factor to generate a task, the generated task may then be used as a factor that influences the activity duration. The ability of the occupant behavior simulation engine 200 to generate one or more activity attributes based on a variety of factors and/or tasks produces a detailed representation of occupant behavior.

The occupant behavior simulation engine 200 receives the recorded occupant behavior data 212 that includes schedules of actual occupants of a representative building structure. The histogram module 205 constructs histograms, having bins for each activity attribute during different time intervals, that are populated with the recorded occupant behavior data 212. The recorded occupant behavior data 212 may not fully populate the histograms. Therefore, the smoothing module 210 is applied for one or more iterations to complete the population of the histogram. The smoothing module 210 extrapolates the occupant behavior data across the bins to produce additional occupant behavior data as need to fully populate the histograms. The normalization module 215 then normalizes the feature values in the smoothed histograms to compute normalized arrays for each feature over the time intervals. The occupant behavior generation module 220 extracts the attribute values based on the normalized arrays and produces the generated occupant behavior for one or more occupants. Together, the histogram module 205, the smoothing module 210, and the normalization module 215 perform a calibration process for the simulation based on the recorded occupant behavior data 212.

Throughout the following description, a first example is described in which a single activity attribute: the task, is generated by the occupant behavior simulation engine 200. In the first example, four possible tasks, named "off", "work", "meet", and "eat" and two factors, the time of day (TOD) and the previous task (PVT) are used. TABLE 1 includes two days of recorded occupant behavior data for an actual occupant of a representative building structure. Each row of TABLE 1 specifies a separate activity. An activity occurs during a time interval that begins at an initial time and ends at the time when the subsequent activity begins. The "NPO" column lists the "number of participating occupants" for each task. On day 0, for example, the occupant had a meeting with four other occupants at 10:02 AM.

TABLE 1

Recorded occupant schedule data for a representative building

| Day 0 | | | Day 1 | | |
|---|---|---|---|---|---|
| Time | Task | NPO | Time | Task | NPO |
| 8:45 AM | Work | 1 | 9:13 AM | Work | 1 |
| 10:02 AM | Meet | 5 | 10:41 AM | Meet | 2 |
| 11:17 AM | Work | 1 | 11:02 AM | Work | 1 |
| 12:10 AM | Eat | 3 | 1:16 PM | Eat | 1 |
| 1:01 PM | Work | 1 | 1:55 PM | Work | 1 |
| 5:46 PM | Off | 1 | 4:32 PM | Meet | 2 |
| | | | 4:51 PM | Work | 1 |
| | | | 4:59 PM | Off | 1 |

The goal of the occupant behavior simulation engine 200 is to automatically generate attributes, tasks in this first example, during a simulation, where the generated occupant behavior that resembles the occupant schedule data in TABLE 1. The first step of the simulation technique performed by the occupant behavior simulation engine 200 is to populate a set of histograms with the recorded occupant behavior data 212.

Figure 3A:
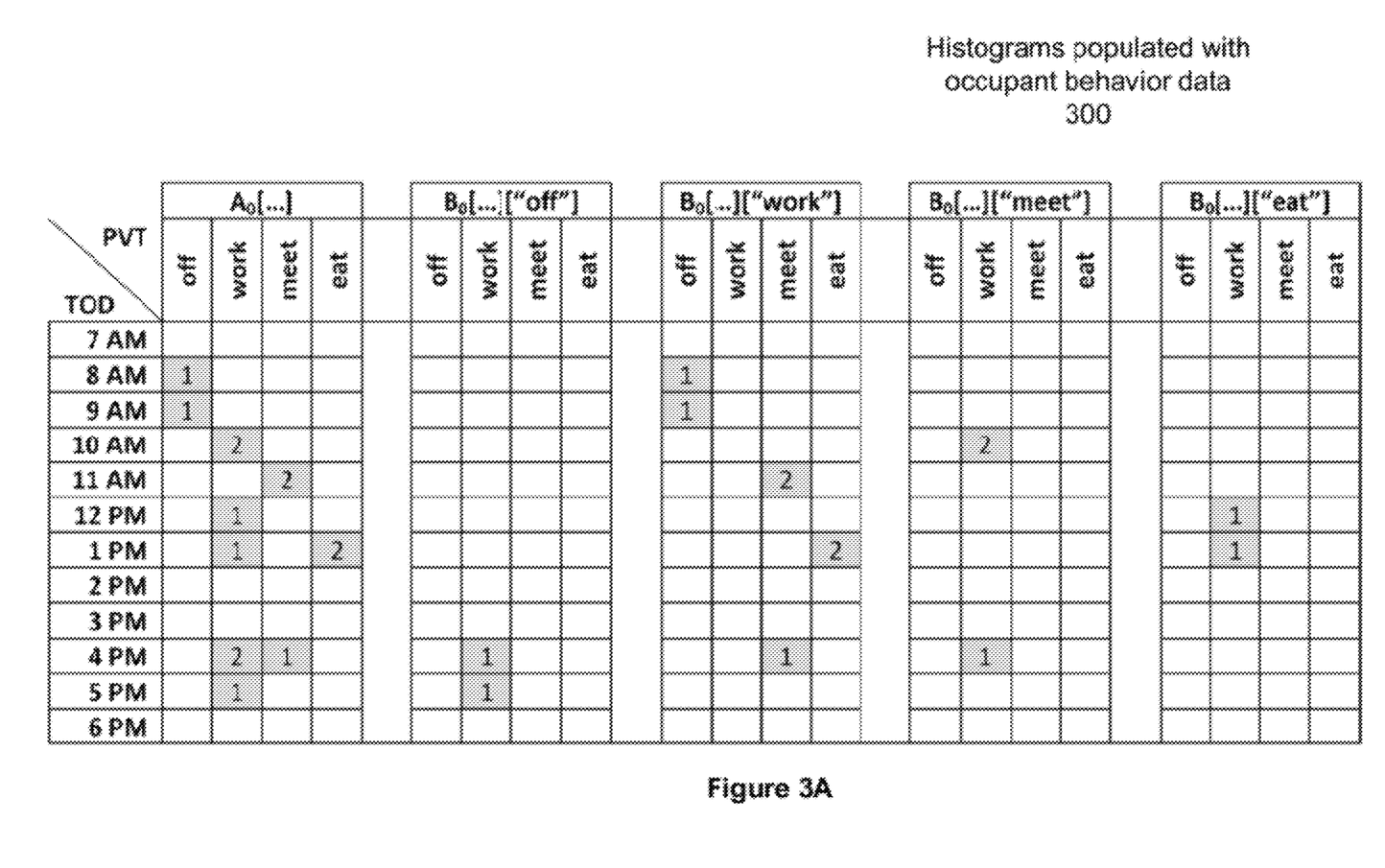
FIG. 3A illustrates histograms populated with recorded occupant behavior data, according to one embodiment of the invention.

FIG. 3A illustrates histograms populated with the recorded occupant behavior data shown in TABLE 1, according to one embodiment of the invention. The histograms are two-dimensional because two factors (TOD and PVT) are used for the example. Each histogram includes one column for each of the four possible previous tasks, and the time of day factor is discretized such that each hour of the day has a corresponding set of histogram bins.

Every activity shown in TABLE 1 contributes a value of 1 to both $A_0$ and one of the other four $B_0$ histograms shown in histograms populated with recorded occupant behavior data 300. Each $B_0$ histogram is associated with a single "feature", and in this specific example there is one feature per possible task. The general mathematical technique allows for any number of features to be selected and each feature can be associated with any quantity of occupants. For the first activity of Day 0, the time (8:45 AM) fits into the "8 AM to 9 AM" slot and the previous task is assumed to be "off". Thus $A_0$["8 AM"; "off"]=1, as shown just under the top-left corner cell of histograms populated with recorded occupant behavior data 300. Because the task performed at 8:45 AM is "work", 1 is added to the corresponding bin of the "work"-specific feature histogram ($B_0$["8 AM"; "off"]["work"]). On both Day 0 and Day 1, the occupant transitions from the "work" task to the "meet" task between 10 AM and 11 AM. Therefore, $A_0$["10 AM";"work"]=$B_0$["10 AM"; "work"]["meet"]=2. On Day 1, the occupant transitioned away from the "work" task at 4:32 PM and 4:59 PM, giving $A_0$["4 PM";"work"]=2. Note that the 4:32 PM activity contributes to $B_0$["4 PM";"work"]["meet"], whereas the 4:59 PM activity affects $B_0$["4 PM";"work"]["off"].

Many bins of the histograms are empty after the histograms are populated with the recorded occupant schedule data from TABLE 1. This problem of sparsely populated histograms may occur, even if hundreds of actual occupant schedules are used to populate the histograms, because when additional factors are used and discretized at higher resolutions, the total number of bins increases. In order to produce the generated occupant behavior 225, the occupant behavior simulation engine 200 extracts information computed based on the bins that are currently empty. Consequently, it is necessary to "smooth" the data populating the bins, propagating values across empty neighboring bins to reduce the sparseness.

In one embodiment the smoothing module 210 performs a smoothing algorithm requiring one "smoothing parameter" $\alpha \langle factor \rangle$ for each factor $\langle factor \rangle$. The smoothing parameters are all non-negative, and the sum of the smoothing parameters is at most 1. The larger a smoothing parameter for a certain factor, the smoother the final data across neighboring bins along the axis associated with that factor. The first step in each smoothing iteration i is to define a set of coefficients $C_i$ using equation (1), one for each histogram bin (identified by $\langle bin \rangle$) and each factor.

$$C_i[\langle bin \rangle][\langle factor \rangle] = \frac{\frac{\alpha \langle factor \rangle}{n \langle factor \rangle} \cdot \sum_{\langle factor \rangle} \alpha \langle factor \rangle}{\sum_{\langle factor \rangle} \alpha \langle factor \rangle + \sqrt{A_i[\langle bin \rangle]}} \quad \text{Equation (1)}$$

If a bin has been heavily populated, the information within the bin is trusted and the effect of the smoothing is lessened by including $\lfloor \langle \sqrt{A_i[\langle bin \rangle]} \rangle \rfloor$ in the denominator. The variable $n \langle factor \rangle$ is the number of neighboring bins along the axis associated with $\langle factor \rangle$. For factors having continuous values, such as the time of day, the neighboring bins are the two adjacent bins (or the one adjacent bin at the edge of a histogram). For discrete factors like tasks, all other bins along the axis are neighbors.

A value $c_i$ is the fraction of each bin's value that will be preserved through the smoothing iteration. While the coefficients $C_i$ are dependent on $\langle factor \rangle$, $c_i$ is not dependent on $\langle factor \rangle$. $c_i$ is computed using equation (2).

$$c_i[\langle bin \rangle] = 1 - \sum_{\langle factor \rangle} (n \langle factor \rangle \cdot C_i[\langle bin \rangle][\langle factor \rangle]) \quad \text{Equation (2)}$$

In a single iteration, convolutions are performed separately for each histogram using the same set of coefficients. The coefficients $C_i$ that are in the set and the fractions $c_i$ are recalculated for each iteration, where i=0 for the first iteration, i=1 for the second iteration, and so forth. In equation (3) shown below, $X_i$ represents any of the histograms for iteration i. We use $\langle bin^* \rangle$ to denote the neighboring bin located at a displacement $\langle offset \rangle$ along the axis associated with $\langle factor \rangle$.

$$X_{i+1}[\langle bin \rangle] = c_i[\langle bin \rangle] \cdot X_i[\langle bin \rangle] + \sum_{\langle factor \rangle} \sum_{\langle offset \rangle} (C_i[\langle bin \rangle \langle factor \rangle] \cdot X_i[\langle bin^* \rangle]) \quad \text{Equation (3)}$$

Figure 3B:
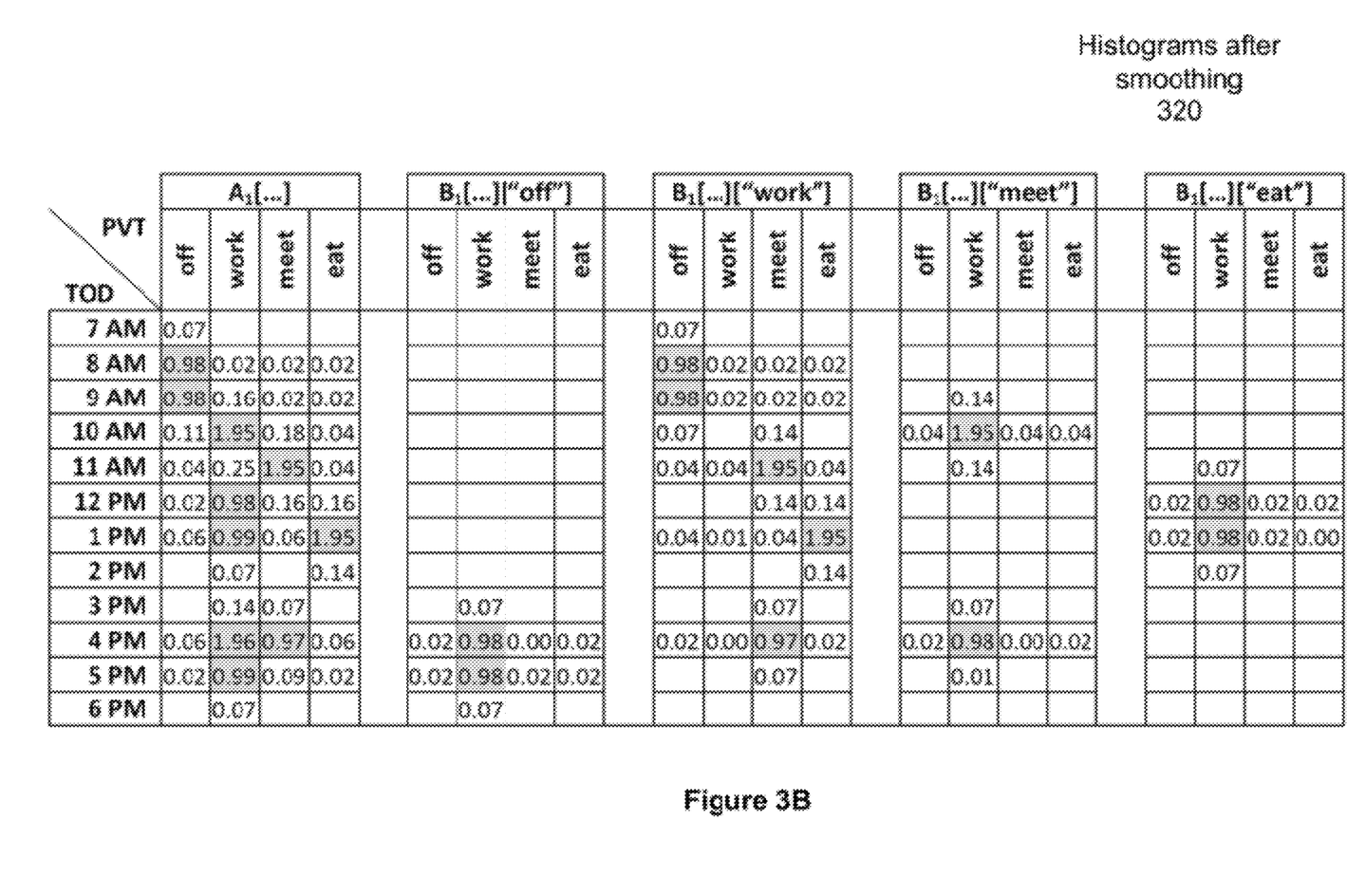
FIG. 3B illustrates the histograms shown in FIG. 3A after smoothing operations, according to one embodiment of the invention.

Continuing with the simplified task generation example, $\alpha_{TOD}$=0.14 and $\alpha_{PVT}$=0.06. FIG. 3B illustrates the histograms shown in FIG. 3A after one iteration of the smoothing operation, according to one embodiment of the invention. Serving as a demonstration of the algorithm performed by the smoothing module 210, the following is a derivation of $A_1$["4 PM";"work"]. Note that the computed value 1.96, resulting from smoothing, in the bin of histograms after smoothing 320 of FIG. 3B.

First, the smoothing coefficient associated with the time of day factor is computed. Because this factor is continuous, there are two neighbors ($n_{TOD}$=2).

$$C_0[\text{``4 PM''; ``work''}][\text{``TOD''}] = \frac{\alpha_{TOD}}{n_{TOD}} \cdot$$

$$\frac{\alpha_{TOD} + \alpha_{PVT}}{\alpha_{TOD} + \alpha_{PVT} + \sqrt{A_0[''4\ PM'','' work'']}}$$

$$= \frac{0.14}{2} \cdot \frac{0.14 + 0.06}{0.14 + 0.06 + \sqrt{2}}$$

$$= 0.0086730 \ldots$$

The smoothing coefficient associated with the previous task is calculated in a similar fashion. In this case, because tasks are discrete and there are four in total, there are three neighbors ($n_{PVT}$=3).

$$C_0[\text{``4 PM'',``work''}][\text{``PVT''}] = 0.0024780 \ldots$$

The $c_0$ value is obtained as follows.

$$c_0[\text{``4 PM''; ``work''}] = 1 - n_{TOD} \cdot C_0[''4\ PM'','' work''][''TOD''] -$$

$$n_{PVT} \cdot C_0[''4\ PM'','' work''][''PVT''] = 0.97522 \ldots$$

Using $A_1$ in place of $X_{i+1}$, the convolution equation computes the value shown in FIG. 3A.

$$A_1[\text{``4 PM''; ``work''}] = c_0[\text{``4 PM''; ``work''}] \cdot A_0[\text{``4 PM''; ``work''}] +$$

$$C_0[\text{``4 PM''; ``work''}][\text{``TOD''}] \cdot A_0[\text{``3 PM''; ``work''}] +$$

$$C_0[\text{``4 PM''; ``work''}][\text{``TOD''}] \cdot A_0[\text{``5 PM''; ``work''}] +$$

$$C_0[\text{``4 PM''; ``work''}][\text{``PVT''}] \cdot A_0[\text{``4 PM''; ``off''}] +$$

$$C_0[\text{``4 PM''; ``work''}][\text{``PVT''}] \cdot A_0[\text{``4 PM''; ``meet''}] +$$

$$C_0[\text{``4 PM''; ``work''}][\text{``PVT''}] \cdot A_0[\text{``4 PM''; ``eat''}] = 1.9616 \ldots$$

The smoothing processes are terminated by the smoothing module 210 after a pre-defined number of iterations n. If empty bins still remain, a greater number of smoothing iterations may be used, lower resolutions on the continuous factors may be selected, or more occupant behavior data may be provided.

Figure 3C:
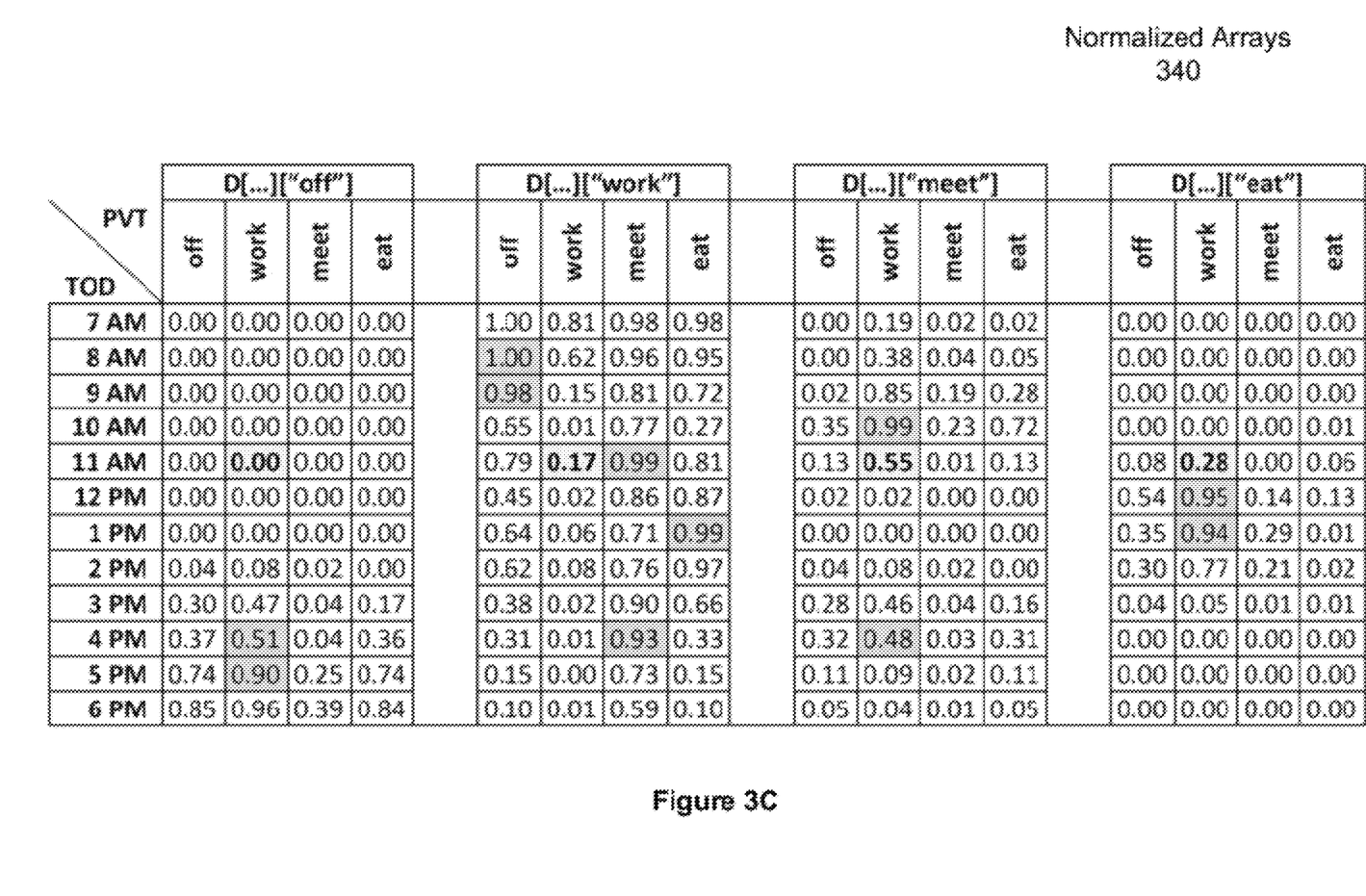
FIG. 3C illustrates normalized arrays generated using the histograms shown in FIG. 3B, according to one embodiment of the invention.

After smoothing the histograms, the feature values $B_n$ are normalized to yield a set of arrays of normalized feature values collectively named D. Normalization is the last step in the calibration process performed by the occupant behavior simulation engine 200. FIG. 3C illustrates normalized arrays 340 generated using the histograms shown in FIG. 3A after 9 iterations of smoothing, according to one embodiment of the invention.

Continuing with the first example, normalization divides the $B_n$ values by corresponding $A_n$ values.

$$D[\langle\text{bin}\rangle\langle\text{feature}\rangle] = \frac{Bn[\langle\text{bin}\rangle][\langle\text{feature}\rangle]}{An[\langle\text{bin}\rangle]}$$

The information shown in the normalized arrays 340 may be used by the occupant behavior generation module 220 to perform a process called extraction during a simulation to generate plausible attributes, such as tasks. Suppose that the current simulated time is 11:30 AM, and a simulated occupant has just completed a "work" activity. To select the next task, the occupant behavior generation module 220 determines the normalized feature values associated with the following TOD and PVT factors.

$D[\text{``11 AM''; ``work''}][\text{``off''}]$=0.00 . . .

$D[\text{``11 AM''; ``work''}][\text{``work''}]$=0.17 . . .

$D[\text{``11 AM''; ``work''}][\text{``meet''}]$=0.55 . . .

$D[\text{``11 AM''; ``work''}][\text{``eat''}]$=0.28 . . .

In this case there is roughly a 17% chance that the occupant will continue working, a 55% chance he/she will meet with other occupants, a 28% chance of taking a break for food, and very little chance he/she will leave for the day. In one embodiment, the occupant behavior generation module 220 selects the next task at random according to the probabilities computed by the occupant behavior generation module 220 using the normalized arrays of feature values. The occupant behavior generation module 220 computes a probability table for each task transition over the time intervals to enable the selection.

Suppose that the occupant completes the "work" activity at 11:45 AM instead of 11:30 AM. In this case, the probabilities may be interpolated. The center of the "11 AM to 12 PM" slot is 11:30 AM, a quarter of an hour before the simulated time, and the center of the "12 PM to 1 PM" slot is 12:30 PM, three quarters of an hour after the simulated time. Using a linear interpolation, the probability that the occupant begins eating is $(3/4) \cdot 0.28 + (1/4) \cdot 0.95$, or 44.75%. The other probabilities may be interpolated in a similar fashion.

Figure 3D:
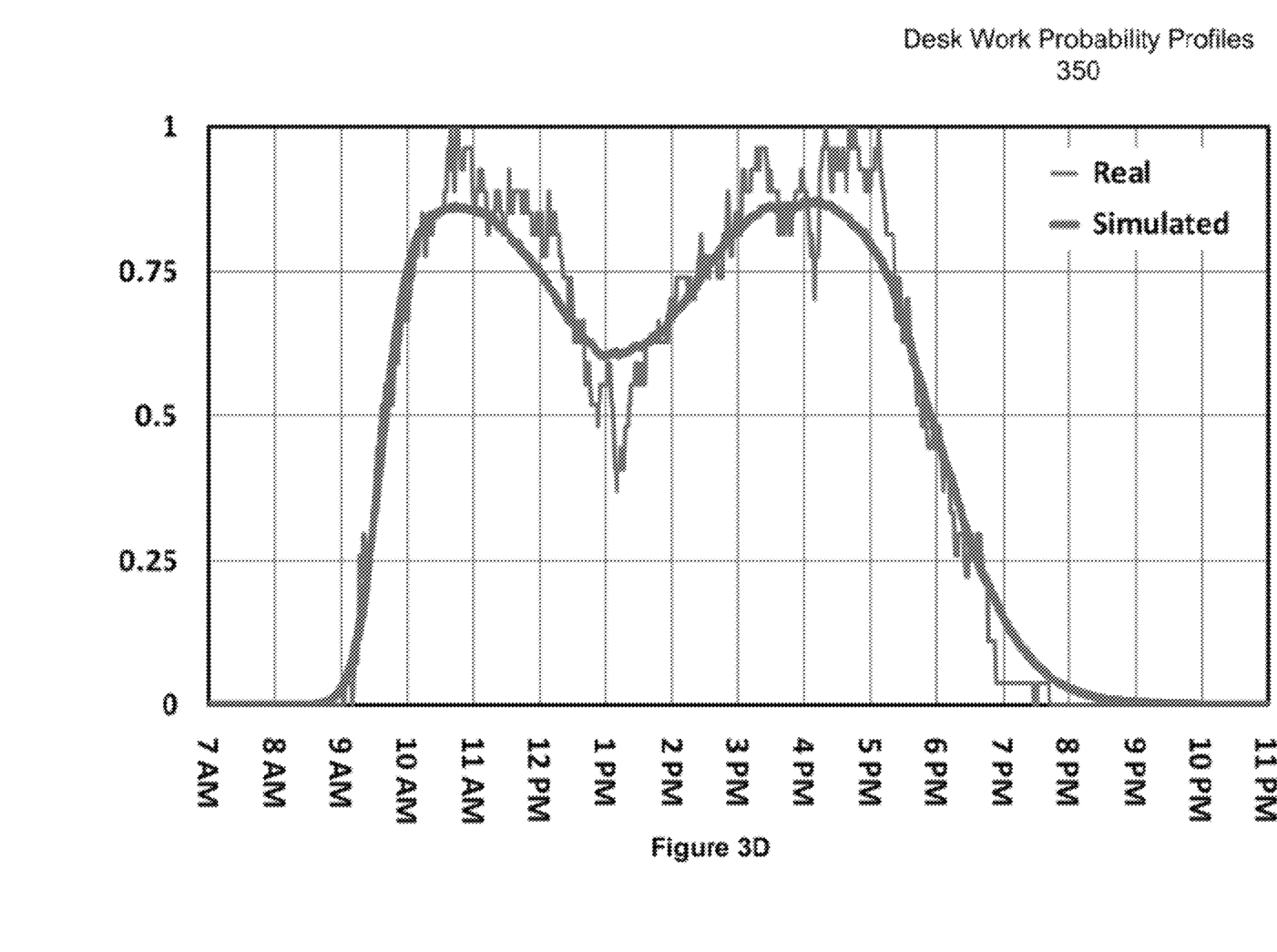
FIG. 3D is a illustrates recorded and simulated desk work probability profiles for building occupants, according to one embodiment of the invention.

FIG. 3D illustrates recorded and simulated desk work probability profiles 350 for building occupants, according to one embodiment of the invention. The jagged line was produced by counting, for each minute of the day, the number of times the actual occupant was recorded performing desk work, then dividing by the total number of recorded schedules (27). The smoother line was calculated in the same fashion, but using 10000 schedules of simulated occupant behavior generated by the occupant behavior simulation engine 200. The real and simulated profiles follow roughly the same path, though evidently the occupant behavior generation module 220 overestimates the probability of desk work around lunch and underestimates the probability of desk work before and after.

Despite the differences between the profiles at certain hours of the day, the real and simulated time-averaged probabilities of desk work are in fairly close agreement. On average, the actual occupant worked at their desk only 3.4 minutes longer per day than the simulated occupant (411.6 minutes total compared with 408.2).

While desk work is typically performed several times per day, the occurrence of certain other tasks is best measured over several days. The actual occupant took a break outside on 14 of 27 days, and so the desired probability that the "break@outside" task occurs in a day is about 51.9%. From 10000 generated schedules, the result was roughly 53.6%. Given that the goal of the occupant behavior simulation engine 200 is to predict human behavior, the error of 1.7% is tolerable.

Different models of occupant behavior may be defined using the application components 112, but with alternative sets of attributes, factors, and features. In a second example, a task, number of participating occupants (NPO), and duration may be generated for each activity. The same smoothing algorithm described in conjunction with the first example is applied to histograms and multi-dimensional histograms and arrays are used to support an arbitrary number of factors. The histogram population, normalization, and extraction procedures performed by the histogram module 205, smoothing module 210, normalization module 215, and occupant behavior generation module 220, respectively, differ somewhat between the three generated attributes, as explained below.

The tasks are generated using three factors, the time of day (TOD), the previous task (PVT), and the task suspension interval (TSI). Two of these, the TOD and the PVT, were used in the first example. The rationale for using TOD as a factor is that the timing of arrivals, departures, and lunch breaks is highly dependent on the time of day. The TOD is discretized into 15-minute intervals, providing a higher resolution than the 60-minute intervals used in the first example. $\alpha_{TOD}=0:23$ in this example.

The rationale for the PVT factor is that certain transitions between tasks are more likely to occur than others. In this example, $\alpha_{PVT}=0$, which prevents a transition from occurring in the simulated schedules if it is not found in the real schedules. With a $\alpha_{PVT}=0$, one would not expect two washroom breaks to be generated back-to-back.

The TSI measures the time elapsed since a task was last performed. Inclusion of the TSI as a factor during the generation of occupant behavior simulation helps reproduce intervals between tasks. This is useful to spread out washroom breaks, or coffee/lunch breaks, for example. A logarithmic discretization may by used, with separate bins for task suspension intervals of 0 to 15 minutes, 15 to $15 \cdot \sqrt{2}$ minutes, $15 \cdot \sqrt{2}$ to 30 minutes, 30 to $30 \cdot \sqrt{2}$ minutes, etc. $\alpha_{TOD}=0:02$.

Whereas the TOD and PVT factors are scalar values, the TSI factor requires a separate time interval for each possible task. This complicates the mathematical procedure demonstrated in smoothing and normalization. When populating a histogram with a single activity, or when extracting a set of probabilities, multiple TSI values must be used to reference histogram bins.

To generate the numbers of participating occupants for each activity, the TOD factor is used. Because an activity's NPO is generated after generating the task for the activity, the current task (TSK) may be used as the other factor. The TOD might well influence the NPO, as an occupant taking a break is more likely to have company around noon than in mid-afternoon. Again, the TOD is discretized at 15-minute intervals, but now $\alpha_{TOD}=0:25$.

The NPO may depend on the TSK, as a task representing meetings is more likely to be collaborative than, for example, a washroom break. A $\alpha_{TSK}$ value of 0 ensures that washroom breaks are always treated as individual activities.

When generating the simulated occupant behavior for the first example, one task was generated per time interval. When generating the NPO, there are far more possible values for each time interval. Therefore, two features, one called "sums" and another called "square sums" are computed. For each activity in the recorded occupant schedules, ½ is subtracted from the number of participants npo. Then (npo−½) is added to the correct bin in the "sums" feature histogram, and (npo−½)² is added to the same bin in the "square_sums" histogram. After n iterations of smoothing, each bin ⟨bin⟩ has the values $A_n[\langle bin \rangle]$, $B_n[\langle bin \rangle]["sums"]$, and $B_n[\langle bin \rangle]["square\_sums"]$.

The normalization equations that are applied by the normalization module 215 are as follows.

$$D[\langle bin\rangle]["mean"] = \frac{Bn[\langle bin\rangle][\langle "sums"\rangle]}{An[\langle bin\rangle]}$$

$$D[\langle bin\rangle]["variance"] = \frac{Bn[\langle bin\rangle][\langle "square\_sums"\rangle]}{An[\langle bin\rangle]} - D[\langle bin\rangle]["mean"]^2$$

During a simulation, with the time of day and the current task known, appropriate distribution parameters, e.g., mean and standard deviation values, can be interpolated from D. A gamma distribution is formulated using the time of day and the current task properties, a positive value may be randomly selected from the gamma distribution, summed with 1, and then converted to a positive integer by rounding down to generate the NPO.

In one embodiment, the duration of an activity depends on the time of day (TOD), the task (TSK), and the number of participating occupants (NPO). The rationale for using the TOD factor is that, for example, an occupant is less likely to work for several hours continuously if it is nearly time to leave the office. 15-minute intervals are selected and $\alpha_{TOD}=0:23$. An activity's duration is highly dependent on the task, therefore $\alpha_{TSK}=0$. A positive $\alpha_{TSK}$ leads to absurdly long washroom breaks, as the durations of the washroom breaks become influenced by the durations of other types of activities.

The NPO factor is used because an occupant may take a longer lunch break if he/she is not by himself/herself. We use separate bins for activities with 1 participant, 2 or 3 participants, 4 to 7, 8 to 15, 16 to 31, 32 to 63, and 64 or more participants. For smoothing, $\alpha_{NPO}=0:02$.

Duration generation is similar to NPO generation. Again, two features are used, adding recorded durations to one feature and squares of the recorded durations to the other feature. Durations may then be randomly generated using gamma distributions. Because a duration is a continuous quantity, offsetting and rounding off of values that was needed to generate an NPO, is not needed to generate a duration.

Ideally, the fictional schedules generated by the occupant behavior simulation engine 200 would be indistinguishable from the recorded occupant schedules used to calibrate the occupant behavior simulation engine 200. In a third example, the occupant behavior simulation engine 200 is calibrated using the same 27 actual occupant schedules. Generated occupant behavior 225 produced by the occupant behavior simulation engine 200 is represented as a schedule shown in TABLE 2. The generated schedule appears plausible in several regards: the arrival and departure times; the fact that the occupant spends most of the day doing desk work; the 6-minute "desk meeting" in the morning; and the fact that the washroom breaks are spread out and range from 1 to 4 minutes in duration. The 13-person lunch break outside the building happens to be consistent with a few of the 27 recorded occupant schedules that were input to the occupant behavior simulation engine 200 as occupant behavior data 212.

TABLE 2

A generated occupant schedule

| Time | Task | NPO |
|---|---|---|
| 9:57 AM | work@desk | 1 |
| 10:19 AM | meet@desk | 2 |
| 10:24 AM | work@desk | 1 |
| 11:37 AM | break@washroom | 1 |
| 11:41 AM | work@desk | 1 |
| 12:01 PM | break@sharedroom | 1 |
| 12:12 PM | break@washroom | 1 |
| 12:13 PM | work@desk | 1 |
| 12:28 PM | break@outside | 13 |
| 1:31 PM | break@washroom | 1 |
| 1:34 PM | work@desk | 1 |
| 2:42 PM | break@washroom | 1 |
| 2:44 PM | work@desk | 1 |
| 4:08 PM | break@sharedroom | 1 |
| 4:13 PM | work@desk | 1 |
| 6:13 PM | off@outside | 1 |

The actual occupant never left the building and returned twice in a single day. This pattern of behavior appears to be reflected in the generated schedules, presumably due to the TSI factor that measures the time elapsed since a task was last performed. But because breaks outside the building ("break@outside") were classified as separate tasks from breaks on site ("break@sharedroom"), the TSI factor did nothing to prevent the outside break in Table 2 from being preceded by the break at 12:01 PM. By combining "break@outside" and "break@sharedroom" into a single task, the generation of multiple breaks around noon may be discouraged. But on the other hand, the tendency for a 13-person "team lunch" to take place at a restaurant, or the trend that 5-minute breaks around 4:08 PM tend to occur on site may be lost. The more general point is that different classification schemes will reproduce different behavioral patterns, while no single classification scheme may be ideal.

Figure 4A:
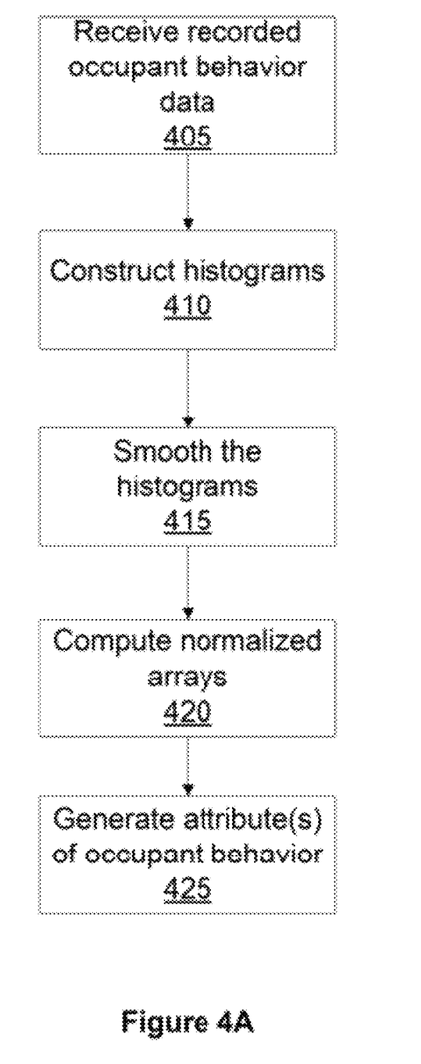
FIG. 4A is a flow diagram of method steps for generating occupant behavior, according to one embodiment of the invention.

FIG. 4A is a flow diagram of method steps for generating occupant behavior, according to one embodiment of the invention. Although the method steps are described in conjunction with the system of FIGS. 1 and 2, persons skilled in the art will understand that any system configured to perform the method steps, in any order, is within the scope of the invention.

The method begins in step 405, when the occupant behavior simulation engine 200 receives the recorded occupant data 212 for a representative building structure. At step 410 the histogram module 205 constructs histograms populated with the recorded occupant data 212. At step 415 the smoothing module 210 performs smoothing operations over one or more iterations to smooth the histograms. At step 420 the normalization module 215 computes normalized arrays using the smoothed histograms. At step 425 the occupant behavior generation module 220 generates one or more attributes of occupant behavior from the normalized arrays.

Figure 4B:
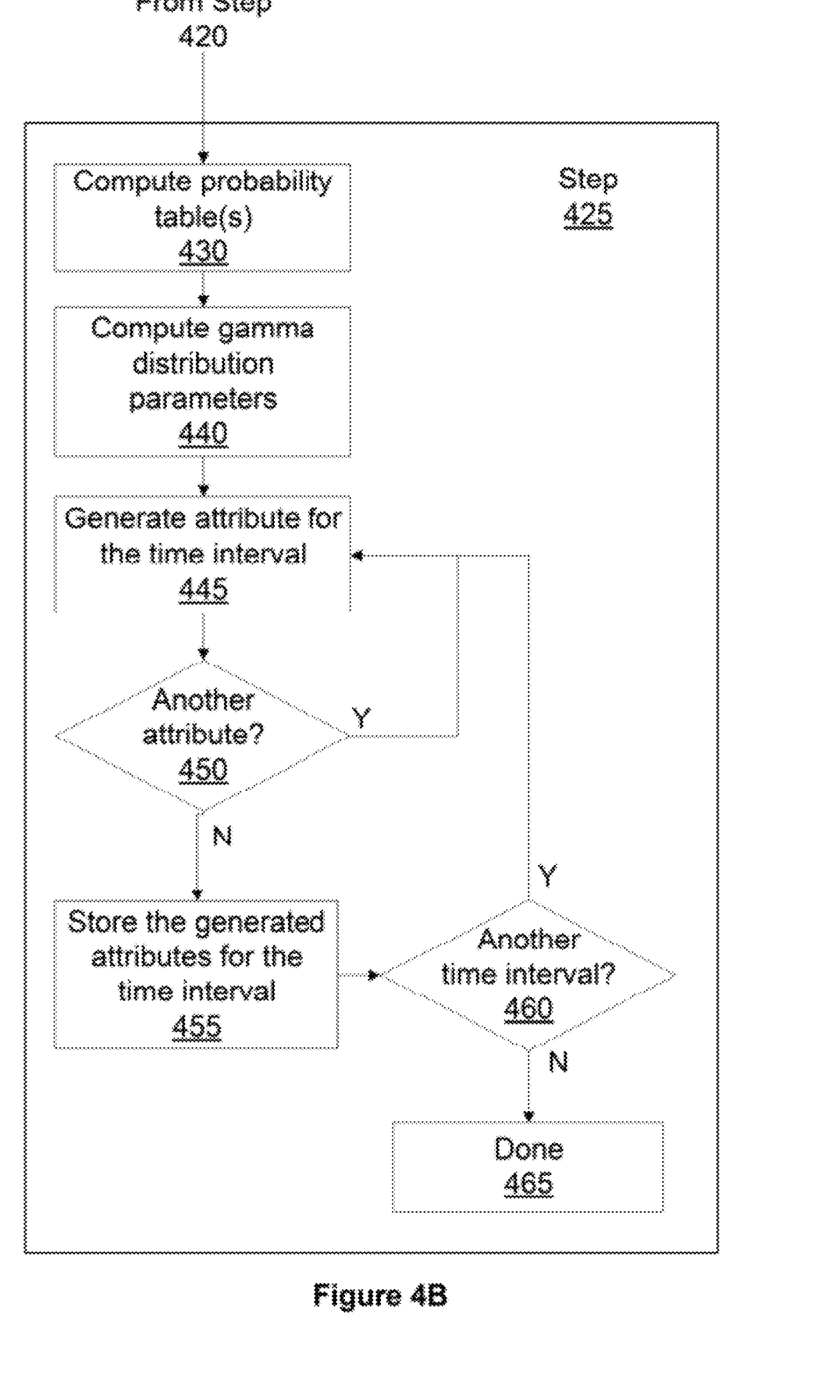
FIG. 4B is a flow diagram of a method step shown in FIG. 4A, according to one embodiment of the invention.

FIG. 4B is a flow diagram of method step 425 shown in FIG. 4A, according to one embodiment of the invention. At step 430 the occupant behavior generation module 220 generates probability table(s) from the normalized arrays of feature values. At step 440 the occupant behavior generation module 220 computes gamma distribution parameters using the normalized arrays of occupant behavior feature values.

At step 445 the occupant schedule generation module 220 generates an occupant behavior attribute for a time interval using the probability tables or the distribution parameters. At step 450 the occupant schedule generation module 220 determines if another occupant behavior attribute should be generated for the time interval, and, if so, the occupant schedule generation module 220 returns to step 445.

Otherwise, at step 455 the occupant schedule generation module 220 stores the generated occupant behavior attributes for the current time interval. At step 460 the occupant schedule generation module 220 determines if occupant behavior attributes should be generated for another time interval, and, if so, the occupant schedule generation module 220 returns to step 445. Otherwise, at step 465 the occupant schedule generation module 220 is done generating occupant behavior attributes.

A number of techniques have previously been developed to simulate the behavior of building occupants based on the recorded schedules of actual occupants. The schedule calibrated method described herein differs from previous technique in that the level of detail may be specified, occupant behavior is modeled by selecting various activity attributes, and the behavioral patterns that are generated by the occupant behavior simulation may be altered by selecting different sets of factors. When tested with selected attributes and factors, the occupant behavior simulation engine 200 generated plausible fictional occupant behavior represented by schedules with acceptable statistical accuracy. The generated occupant behavior 225 may be incorporated into building performance simulation to address the need for improved decision-support in building design, allowing architects to conveniently and accurately predict the energy use associated with different design options for a target building structure.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writeable storage media (e.g., floppy disks within a diskette drive or hard-disk drive or any type of solid-state random-access semiconductor memory) on which alterable information is stored.

While the foregoing is directed to embodiments of the present invention, other and further embodiments of the invention may be devised without departing from the basic scope thereof, and the scope thereof is determined by the claims that follow.

The invention claimed is:

1. A computer-implemented method for simulating occupant behavior for a target building structure, the method comprising:
receiving, via a simulation engine, recorded occupant behavior data associated with a representative building structure;
constructing a histogram of at least two dimensions that is populated with the recorded occupant behavior data;
smoothing the recorded occupant behavior data to fully populate the histogram, wherein the smoothing comprises:

determining a smoothing parameter value for each of one or more factors that influences the one or more attributes, and computing a smoothing coefficient for each of the plurality of bins based on the smoothing parameter values and a number of neighboring bins;

computing normalized arrays of occupant behavior feature values based on the histogram;

generating one or more attributes of occupant behavior for a simulated occupant of the target building structure based on the normalized arrays of occupant behavior feature values; and generating a simulation of occupant behavior based on the generated one or more attributes of occupant behavior, wherein the simulation indicates a predicted energy demand of the target building structure.

2. The method of claim 1, wherein the one or more attributes include a task performed by the simulated occupant of the target building structure.

3. The method of claim 1, wherein the one or more attributes include a time duration during which a task is performed by the simulated occupant of the target building structure.

4. The method of claim 1, wherein the one or more attributes include a number of participants associated with a simulated task performed by the simulated occupant of the target building structure.

5. The method of claim 1, wherein generating one or more attributes comprises:

computing a probability table based on the normalized arrays of occupant behavior feature values;

computing one or more gamma distribution parameters based on the normalized arrays of occupant behavior feature values; and generating a first occupant behavior attribute for a sub interval based on the probability table or the gamma distribution parameters.

6. The method of claim 1, wherein a number of dimensions of the histogram equals a number of factors that influence the one or more attributes.

7. The method of claim 6, wherein the factors comprise at least one of time of day, the previous task performed by an actual occupant, time elapsed since a task was performed by the actual occupant, and a number of occupants participating in a task.

8. The method of claim 1, wherein computing the normalized arrays further comprises:

calculating a probability value of the occupant performing another task based, at least in part, on performing a previous task that is performed before the another task, wherein the another task, a next task, and the previous task each comprise different tasks and the probability value is calculated based, at least in part, on the recorded occupant behavior data.

9. The method of claim 1, wherein computing the normalized arrays further comprises:

calculating a probability value of the occupant performing a next task based, at least in part, on performing a previous task that is performed before the next task, wherein the next task and the previous task comprise different tasks and the probability value is calculated based, at least in part, on the recorded occupant behavior data.

10. A non-transitory computer-readable storage medium storing instructions that, when executed by a processor, cause a computer system to perform an operation for simulating occupant behavior for a target building structure, the operation comprising:

receiving recorded occupant behavior data associated with a representative building structure;

constructing a histogram of at least two dimensions that is populated with the recorded occupant behavior data;

smoothing the recorded occupant behavior data to fully populate the histogram, wherein the smoothing comprises:

determining a smoothing parameter value for each of one or more factors that influences the one or more attributes, and computing a smoothing coefficient for each of the plurality of bins based on the smoothing parameter values and a number of neighboring bins;

computing normalized arrays of occupant behavior feature values based on the histogram;

generating one or more attributes of occupant behavior for a simulated occupant of the target building structure based on the normalized arrays of occupant behavior feature values; and generating a simulation of occupant behavior based on the generated one or more attributes of occupant behavior, wherein the simulation indicates a predicted energy demand of the target building structure.

11. The non-transitory computer-readable storage medium of claim 10, wherein the one or more attributes include a task performed by the simulated occupant of the target building structure.

12. The non-transitory computer-readable storage medium of claim 10, wherein the one or more attributes include a time duration during which a task is performed by the simulated occupant of the target building structure.

13. The non-transitory computer-readable storage medium of claim 10, wherein the one or more attributes include a number of participants associated with a simulated task performed by the simulated occupant of the target building structure.

14. The non-transitory computer-readable storage medium of claim 10, wherein generating one or more attributes comprises:

computing a probability table based on the normalized arrays of occupant behavior feature values;

computing one or more gamma distribution parameters based on the normalized arrays of occupant behavior feature values; and generating a first occupant behavior attribute for a sub interval based on the probability table or the gamma distribution parameters.

15. The non-transitory computer-readable storage medium of claim 10, wherein a number of dimensions of the histogram equals a number of factors that influence the one or more attributes.

16. The non-transitory computer-readable storage medium of claim 15, wherein the factors comprise at least one of time of day, the previous task performed by an actual occupant, time elapsed since a task was performed by the actual occupant, and a number of occupants participating in a task.

17. A computing system configured to simulate occupant behavior for a target building structure, comprising:

a memory configured to store an application program and recorded occupant behavior data associated with a representative building structure associated with the application program; and a processor that is configured to:
receive the recorded occupant behavior data associated with the representative building structure,
construct a histogram of at least two dimensions that is populated with the recorded occupant behavior data,
smoothing the recorded occupant behavior data to fully populate the histogram, wherein the smoothing comprises:
determining a smoothing parameter value for each of one or more factors that influences the one or more attributes; and
computing a smoothing coefficient for each of the plurality of bins based on the smoothing parameter values and a number of neighboring bins,
compute normalized arrays of occupant behavior feature values based on the histogram;
generate one or more attributes of occupant behavior for a simulated occupant of the target building structure based on the normalized arrays of occupant behavior feature values,
store the one or more attributes of occupant behavior in the memory, and
generate a simulation of occupant behavior based on the generated one or more attributes of occupant behavior, wherein the simulation indicates a predicted energy demand of the target building structure.

18. The computing system of claim 17, wherein a number of dimensions of the histogram equals a number of factors that influence the one or more attributes.

* * * * *